United States Patent
Kim et al.

(10) Patent No.: US 8,471,616 B2
(45) Date of Patent: Jun. 25, 2013

(54) DUTY RATIO CORRECTION CIRCUIT

(75) Inventors: Young-wook Kim, Gunpo-si (KR); Soon-bok Jang, Seoul (KR); Jong-uk Song, Seoul (KR); Hwa-seok Oh, Yongin-si (KR); Sung-ha Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/533,001

(22) Filed: Jun. 26, 2012

(65) Prior Publication Data
US 2013/0015897 A1    Jan. 17, 2013

(30) Foreign Application Priority Data
Jul. 11, 2011   (KR) .................. 10-2011-0068552

(51) Int. Cl.
*H03L 7/06*    (2006.01)
(52) U.S. Cl.
USPC ......................................... 327/158; 327/149
(58) Field of Classification Search
USPC .................................................. 327/149, 158
See application file for complete search history.

(56) References Cited

U.S. PATENT DOCUMENTS

| | | | | |
|---|---|---|---|---|
| 6,147,513 A * | 11/2000 | Bui | ............................. | 326/83 |
| 6,188,060 B1 * | 2/2001 | Kim et al. | ................. | 250/214 R |
| 6,324,135 B1 * | 11/2001 | Kim et al. | ................. | 369/47.17 |
| 6,611,485 B2 * | 8/2003 | Kim et al. | ................. | 369/59.18 |
| 7,586,349 B2 * | 9/2009 | Tambouris | ................... | 327/175 |
| 7,830,185 B2 * | 11/2010 | Kim et al. | ..................... | 327/158 |
| 2002/0006097 A1 * | 1/2002 | Kim et al. | ................. | 369/59.18 |
| 2003/0198163 A1 * | 10/2003 | Kim et al. | ................. | 369/53.31 |
| 2007/0132494 A1 * | 6/2007 | Kim | ............................ | 327/175 |
| 2008/0042705 A1 * | 2/2008 | Kim et al. | ..................... | 327/158 |
| 2011/0109354 A1 * | 5/2011 | Feng et al. | ..................... | 327/156 |
| 2011/0291724 A1 * | 12/2011 | Jain et al. | ....................... | 327/175 |
| 2012/0086488 A1 * | 4/2012 | Willey | .......................... | 327/175 |

FOREIGN PATENT DOCUMENTS

| | | | |
|---|---|---|---|
| JP | 2001-144590 | A | 5/2001 |
| JP | 2005-159613 | A | 6/2005 |
| KR | 10-0557580 | B1 | 3/2006 |
| KR | 10-2008-0069756 | A | 7/2008 |

* cited by examiner

*Primary Examiner* — Adam Houston
(74) *Attorney, Agent, or Firm* — Sughrue Mion, PLLC

(57) ABSTRACT

A duty ratio correction circuit for correcting a duty ratio of a clock signal. The duty ratio correction circuit includes an asymmetry buffer that receives a clock signal and adjusts a duty ratio of the clock signal in response to control signals; a clock generating circuit that is connected to the asymmetry buffer and detects the duty ratio of the clock signal; and a controller that generates the control signals according to the duty ratio of the clock signal. An operation of the controller is recorded as a program on a computer-readable recording medium.

18 Claims, 7 Drawing Sheets

DUTY RATIO CORRECTION CIRCUIT

CROSS-REFERENCE TO RELATED APPLICATIONS

This application claims priority from Korean Patent Application No. 10-2011-0068552, filed on Jul. 11, 2011, in the Korean Intellectual Property Office, the disclosure of which is incorporated by reference herein in its entirety.

BACKGROUND

1. Field

Apparatuses, devices, and circuits consistent with the present inventive concept relate to correcting a duty ratio of a clock signal.

2. Description of Related Art

In a semiconductor device that inputs and outputs data by using a clock signal, it is advantageous to correctly control a duty ratio of the clock signal. In general, a clock signal with a duty ratio of 50:50 is mainly used in digital clock applications such as semiconductor integrated circuits. A duty ratio of 50:50 represents that a high level duration is the same as a low level duration in a clock signal. In order to generate and maintain a clock signal with a duty ratio of 50:50, a duty ratio correction circuit is used.

SUMMARY

It is an aspect to provide a method and circuit for correcting a duty ratio for providing a clock signal with a constant duty ratio of 50:50.

According to an aspect of one or more exemplary embodiments, there is provided a duty ratio correction circuit including an asymmetry buffer that receives a clock signal and adjusts a duty ratio of the clock signal in response to control signals; a clock generating circuit that is connected to the asymmetry buffer and detects the duty ratio of the clock signal; and a controller that generates the control signals according to the duty ratio of the clock signal, wherein an operation of the controller is recorded as a program on a computer-readable recording medium.

The asymmetry buffer may include a plurality of PMOS transistors that are connected in parallel to each other between a power voltage and the clock signal and are selectively turned on in response to first control signals of the control signals; and a plurality of NMOS transistors that are connected in parallel to each other between the clock signal and a ground voltage and are selectively turned on in response to second control signals of the control signals.

The plurality of PMOS transistors may have a same size, and the plurality of NMOS transistors have a same size.

The plurality of PMOS transistors may have different sizes, and the plurality of NMOS transistors have different sizes.

The clock generating circuit may include a delay locked loop (DLL) circuit and may output the clock signal so that a rising edge or a falling edge of the clock signal is generated to correspond to an intermediate portion of a window of data.

The clock generating circuit may further include a comparator that detects the duty ratio of the clock signal.

The controller may generate the control signals in order to correct a skew of the clock signal, the skew occurring at a pad connected to the clock generating circuit.

According to another aspect of one or more exemplary embodiments, there is provided a duty ratio correction circuit including a first asymmetry buffer that receives a first clock signal and adjusts a duty ratio of the first clock signal in response to first control signals; a clock generating circuit that is connected to the first asymmetry buffer, receives the first clock signal, and generates a second clock signal; a second asymmetry buffer that receives the second clock signal, adjusts a duty ratio of the second clock signal in response to second control signals, and transfers the second clock signal to a pad; and a controller that generates the first control signals and second control signals, wherein an operation of the controller is recorded as a program on a computer-readable recording medium.

The first control signals may include third control signals and fourth control signals, and the first asymmetry buffer may include a plurality of PMOS transistors that are connected in parallel to each other between a power voltage and the first clock signal and are selectively turned on in response to the third control signals; and a plurality of NMOS transistors that are connected in parallel to each other between the first clock signal and a ground voltage and are selectively turned on in response to the fourth control signals.

The second control signals may include fifth control signals and sixth control signals, and the second asymmetry buffer may include a plurality of PMOS transistors that are connected in parallel to each other between a power voltage and the second clock signal and are selectively turned on in response to the fifth control signals; and a plurality of NMOS transistors that are connected in parallel to each other between the second clock signal and a ground voltage and are selectively turned on in response to the sisth control signals.

The duty ratio correction circuit may further include a third asymmetry buffer connected between the pad and the clock generating circuit, wherein the third asymmetry buffer may receive a third clock signal transmitted through the pad to the third asymmetry buffer and adjust a duty ratio of the third clock signal in response to seventh control signals.

The seventh control signals may include eighth control signals and ninth control signals, and the third asymmetry buffer may include a plurality of PMOS transistors that are connected in parallel to each other between a power voltage and the second clock signal and are selectively turned on in response to the eighth control signals; and a plurality of NMOS transistors that are connected in parallel to each other between the third clock signal and a ground voltage and are selectively turned on in response to the ninth control signals.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
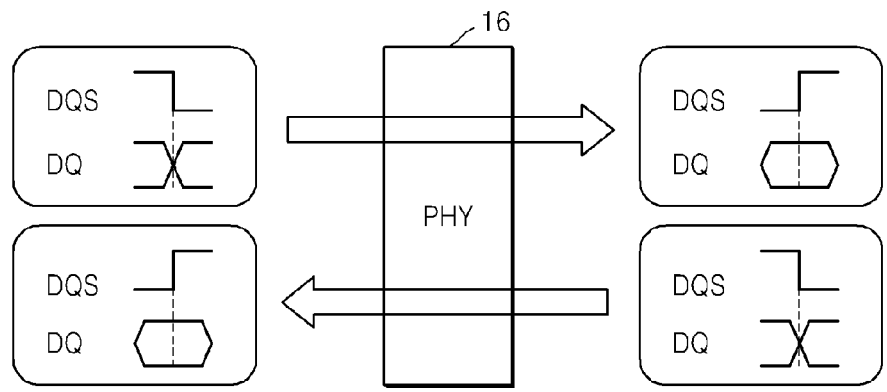
FIG. 1 is a diagram for describing a concept of correction of a duty ratio, according to an exemplary embodiment.

Exemplary embodiments will now be described more fully with reference to the accompanying drawings, in which exemplary embodiments of the inventive concept are shown. The inventive concept may, however, be embodied in many different forms and should not be construed as being limited to the exemplary embodiments set forth herein; rather, these exemplary embodiments are provided so that this disclosure will be thorough and complete, and will fully convey the concept of the inventive concept to those of ordinary skill in the art. In the drawings, the thicknesses of layers and regions are exaggerated for clarity.

The terminology used herein is for the purpose of describing exemplary embodiments only and is not intended to be limiting of the inventive concept. As used herein, the singular forms "a", "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to generate a clock signal with a duty ratio of 50:50, a duty ratio correction circuit is used. When a clock signal with a duty ratio that is not 50:50 is input, the duty ratio correction circuit converts and outputs a clock signal with a duty ratio of 50:50.

FIG. 1 is a diagram for describing a concept of correction of a duty ratio, according to an exemplary embodiment.

Referring to FIG. 1, a PHY block 16 converts a clock signal DQS so that a rising/falling edge of the clock signal DQS is generated to correspond to an intermediate portion of a window of data DQ. The PHY block 16 is a clock generating circuit block for generating the rising/falling edge of the clock signal DQS to correspond to the intermediate portion of the window of the data DQ by using a delay locked loop (DLL) circuit and by shifting the clock signal DQS. The PHY block 16 exists as a physical layout block of a clock generating circuit and ensures a timing margin of the clock signal DQS. For a stable operation of the PHY block 16, a duty ratio of the clock signal DQS is maintained to be 50:50.

Due to an unstable supply by a clock source for supplying the clock signal DQS and to interference during transmission of the clock signal DQS, a duty ratio of the clock signal DQS may be distorted. When the duty ratio of the clock signal DQS deviates from an allowable range, an element for correcting the deviation is used. The clock signal DQS used herein may be a clock signal CLK, a read enable signal REB, and the like as well as a data strobe signal.

Figure 2:
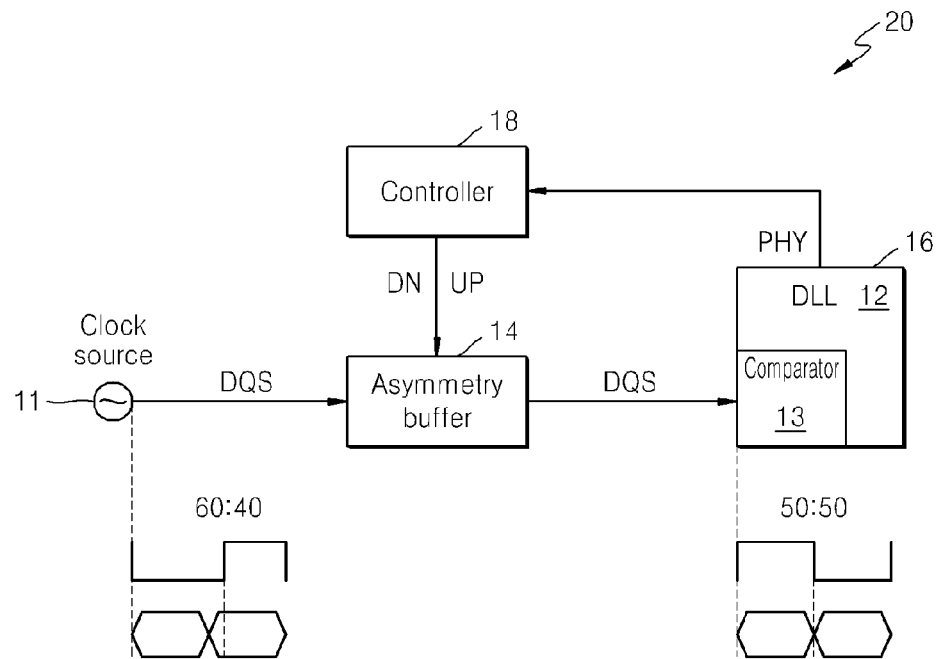
FIG. 2 is a block diagram of a duty ratio correction circuit according to an exemplary embodiment.

FIG. 2 is a block diagram of a duty ratio correction circuit according to an exemplary embodiment.

Referring to FIG. 2, when the duty ratio correction circuit 20 detects a duty ratio of the clock signal DQS and the duty ratio of the clock signal DQS is not 50:50, the duty ratio correction circuit 20 generates the clock signal DQS with a duty ratio of 50:50. The duty ratio correction circuit 20 includes an asymmetry buffer 14, a PHY block 16, and a controller 18. The duty ratio correction circuit 20 may be connected to a clock source 11.

The clock source 11 supplies the clock signal DQS. Due to an unstable supply of the clock signal DQS by the clock source 11, the duty ratio of the clock signal DQS may be distorted. For example, it is assumed that the duty ratio of the clock signal DQS is 60:40.

The asymmetry buffer 14 receives the clock signal DQS supplied from the clock source 11 and supplies the clock signal DQS to the PHY block 16. In addition, the asymmetry buffer 14 adjusts the duty ratio of the clock signal DQS in response to a first control signal UP and a second control signal DN output from the controller 18, and provides the clock signal DQS to the PHY block 16.

The PHY block 16 includes a DLL circuit 12 and a comparator 13. The DLL circuit 12 receives the clock signal DQS and adjusts the clock signal DQS so that a rising/falling edge of the clock signal DQS is generated to correspond to an intermediate portion of a window of data (not shown). The comparator 13 detects the duty ratio of the clock signal DQS. The duty ratio detected by the comparator 13 is provided to the controller 18.

The controller 18 generates the first control signal UP and the second control signal DN according to the duty ratio of the clock signal DQS, which is detected by the comparator 13 of the PHY block 16. The first control signal UP and the second control signal DN are used to adjust the duty ratio of the clock signal DQS. The first control signal UP and the second control signal DN may be set so that when the first control signal UP is activated, a high level duration of the clock signal DQS may be increased, and when the second control signal DN is activated, a low level duration of the clock signal DQS may be increased.

Figure 3:
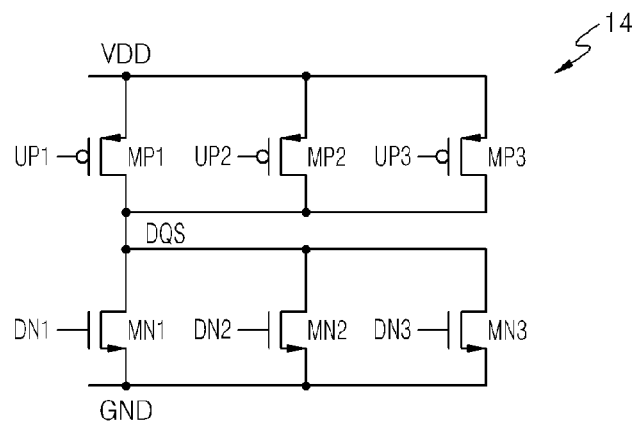
FIG. 3 is a circuit diagram of an asymmetry buffer of the duty ratio correction circuit of FIG. 2

FIG. 3 is a circuit diagram of the asymmetry buffer of the duty ratio correction circuit of FIG. 2.

Referring to FIG. 3, the asymmetry buffer 14 includes a plurality of PMOS transistors MP1, MP2, and MP3 and a plurality of NMOS transistors MN1, MN2, and MN3. For convenience of description, a case where the asymmetry buffer 14 includes three PMOS transistors MP1, MP2, and MP3 and three NMOS transistors MN1, MN2, and MN3 is illustrated. However, the number of transistors is not particularly limited to three, and the number may be more or less than three. The PMOS transistors MP1, MP2, and MP3 are connected in parallel to each other between a power voltage VDD and the clock signal DQS, and are selectively turned on or off in response to first control signals UP1, UP2, and UP3, respectively. The PMOS transistors MP1, MP2, and MP3 may have the same size with the same width and length, or may have different sizes. The PMOS transistor MP1 is turned on in response to the first control signal UP1, the PMOS transistor MP2 is turned on in response to the first control signal UP2, and the PMOS transistor MP3 is turned on in response to the first control signal UP3.

The NMOS transistors MN1, MN2, and MN3 are connected in parallel to each other between the clock signal DQS and a ground voltage GND, and are selectively turned on or off in response to second control signals DN1, DN2, and DN3, respectively. The NMOS transistors MN1, MN2, and MN3 may have the same size with the same width and length, or may have different sizes. The NMOS transistor MN1 is turned on in response to the second control signal DN1, the NMOS transistor MN2 is turned on in response to the second control signal DN2, and the NMOS transistor MN3 is turned on in response to the second control signal DN3.

According to the number of PMOS transistors that are selectively turned on according to the first control signals UP1, UP2, and UP3, from among the PMOS transistors MP1, MP2, and MP3, a driving strength from the power voltage VDD may be determined. That is, when two PMOS transistors are turned on from among the PMOS transistors MP1, MP2, and MP3, the driving strength from the power voltage VDD may be increased compared to a case where a single PMOS transistor is turned on. In addition, when three PMOS transistors are turned on from among the PMOS transistors MP1, MP2, and MP3, the driving strength from the power voltage VDD may be increased compared to a case where two PMOS transistors are turned on. That the driving strength from the power voltage VDD is increased denotes that a transition to a high level of the clock signal DQS connected to drains of the PMOS transistors MP1, MP2, and MP3 is quickly performed and a high level duration of the clock signal DQS is increased.

According to the number of NMOS transistors that are selectively turned on according to the second control signals DN1, DN2, and DN3, from among the NMOS transistors MN1, MN2, and MN3, a driving strength from the ground voltage GND of the asymmetry buffer 14 may be determined. That is, when two NMOS transistors are turned on from among the NMOS transistors MN1, MN2, and MN3, the driving strength from the ground voltage GND is increased compared to a case where a single NMOS transistor is turned on. In addition, when three NMOS transistors are turned on from among the NMOS transistors MN1, MN2, and MN3, the driving strength from the ground voltage GND is increased compared to a case two NMOS transistors are turned on. That the driving strength from the ground voltage GND is increased denotes that transition to a low level of the clock signal DQS connected to drains of the NMOS transistors MN1, MN2, and MN3 is quickly performed and a low level duration of the clock signal DQS is increased.

Figure 4A:
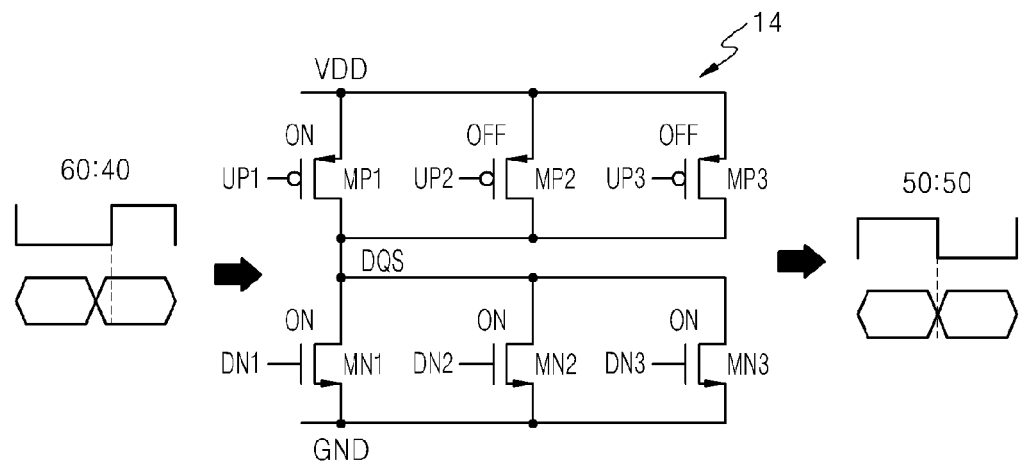
FIGS. 4A and 4B are diagrams illustrating methods of adjusting a driving strength of an asymmetry buffer, according to an exemplary embodiment.
Figure 4B:
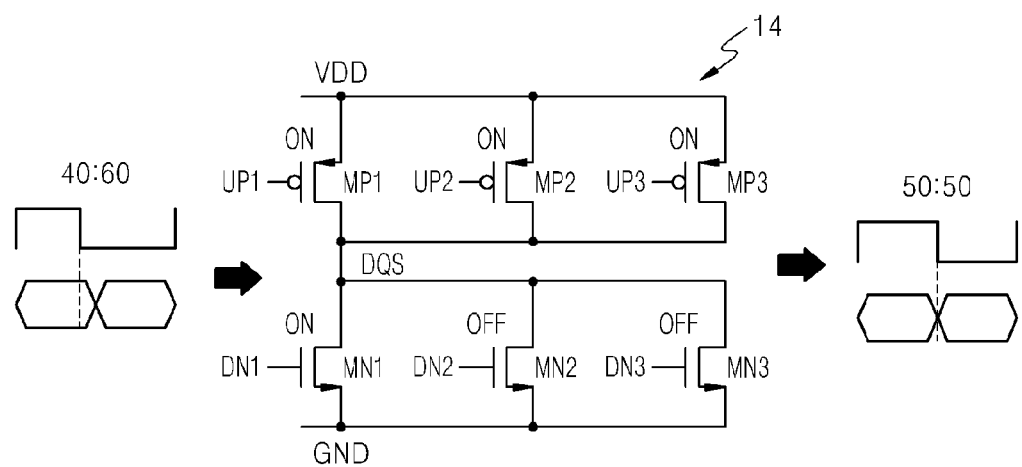

FIGS. 4A and 4B are diagrams illustrating methods of adjusting a driving strength of the asymmetry buffer, according to an exemplary embodiment.

Referring to FIG. 4A, when a duty ratio of the clock signal DQS received by the asymmetry buffer 14 is, for example, 60:40, the PMOS transistor MP1 and the NMOS transistors MN1 through MN3 are turned on. Because the driving strength from the power voltage VDD is increased compared to the driving strength from the ground voltage GND, a high level duration of the clock signal DQS is reduced and a low level duration of the clock signal DQS is increased. Accordingly, the duty ratio of the clock signal DQS is adjusted to be 50:50.

Referring to FIG. 4B, when a duty ratio of the clock signal DQS received by the asymmetry buffer 14 is, for example, 40:60, the PMOS transistors MP1 through MP3 and the NMOS transistor MN1 are turned on. As the driving strength from the power voltage VDD is increased compared to the driving strength from the ground voltage GND, a low level duration of the clock signal DQS is reduced and a high level duration of the clock signal DQS is increased. Accordingly, the duty ratio of the clock signal DQS is adjusted to be 50:50.

Figure 5:
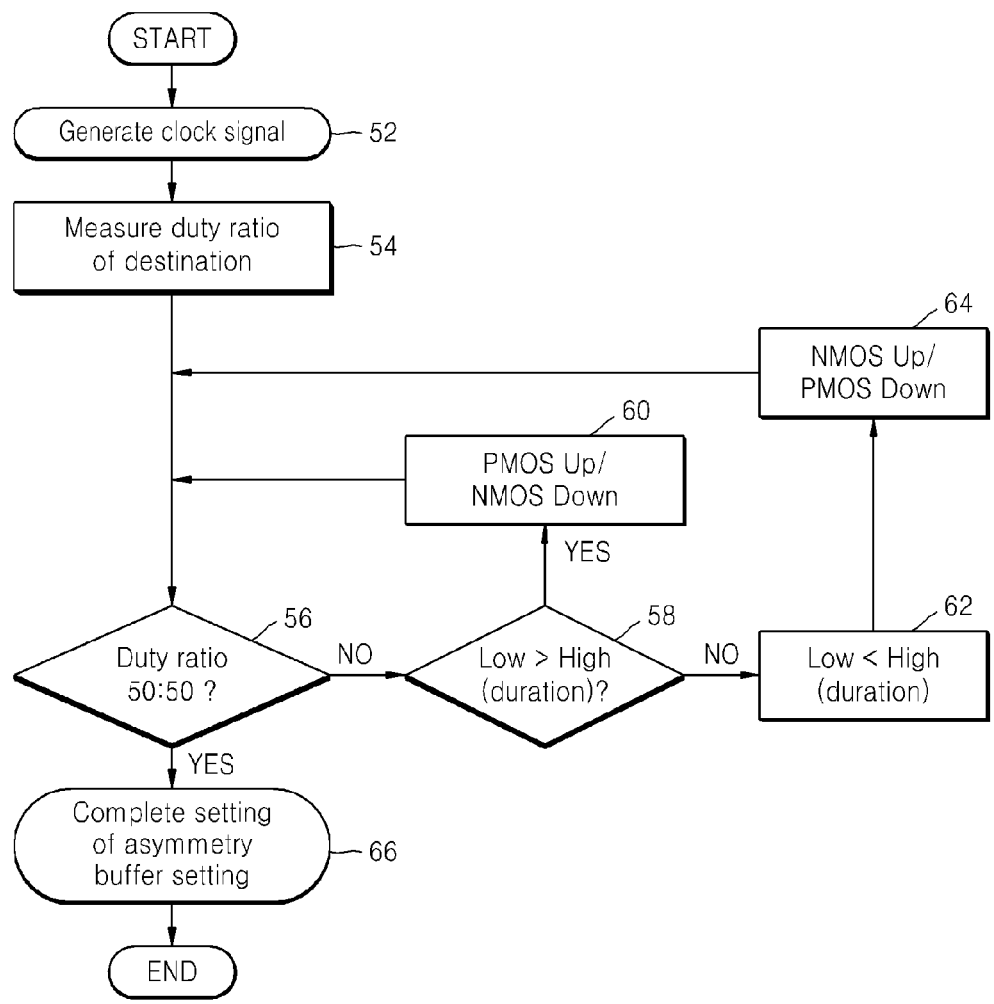
FIG. 5 is a flowchart of a duty ratio correction method of a controller of FIG. 2, according to an exemplary embodiment.

In order to control the driving strength of the asymmetry buffer 14, the controller 18 (refer to FIG. 2) uses a duty ratio correction method shown in FIG. 5.

Referring to FIG. 5 in conjunction with FIG. 2, the clock source unit 12 generates the clock signal DQS (operation 52) and a destination in which the clock signal DQS is used, that is, the PHY block 16 measures a duty ratio of the clock signal DQS (operation 54). The duty ratio of the clock signal DQS is detected by the comparator 13 included in the PHY block 16 (operation 56).

When the duty ratio of the clock signal DQS is not 50:50 (operation 56, NO), a low level duration of the clock signal DQS is compared with a high level duration of the clock signal DQS. If the low level duration of the clock signal DQS is greater than the high level duration of the clock signal DQS (operation 58, YES), the first control signals UP1, UP2, and UP3 are selectively activated to turn on the PMOS transistors MP1, MP2, and MP3 included in the asymmetry buffer 14, respectively (operation 60), and/or the second control signals DN1, DN2, and DN3 are selectively inactivated to turn off the NMOS transistors MN1, MN2, and MN3, respectively (operation 60). Then, whether the duty ratio of the clock signal DQS is 50:50 is detected (operation 56).

When the duty ratio of the clock signal DQS is not 50:50 (operation 56, NO), if the low level duration of the clock signal DQS is not greater than the high level duration of the clock signal DQS (operation 58, NO), then the high level duration of the clock signal DQS is greater than the low level duration of the clock signal DQS (operation 62), and the first control signals UP1, UP2, and UP3 are selectively inactivated to turn off the PMOS transistors MP1, MP2, and MP3 included in the asymmetry buffer 14, respectively (operation 64), and/or the second control signals DN1, DN2, and DN3 are selectively inactivated to turn on the NMOS transistors MN1, MN2, and MN3, respectively (operation 64). Then, whether the duty ratio of the clock signal DQS is 50:50 is detected (operation 56).

Otherwise, when the duty ratio of the clock signal DQS is adjusted to be 50:50 (operation 56, YES), setting operations of the first control signals UP1, UP2, and UP3 and the second control signals DN1, DN2, and DN3 in the asymmetry buffer 14 are completed (operation 66). The duty ratio of the clock signal DQS is adjusted to be 50:50 in the PHY block 16 by using the duty ratio correction method according to the present exemplary embodiment.

The duty ratio correction method of the controller 18, according to the present exemplary embodiment, may alternatively be embodied as a program that is executed by various types of computers and may be recorded in a computer-readable recording medium. The computer-readable recording medium may include a program command, a data file, a data structure, and the like, which are used alone or in combination thereof. The program command recorded in the computer-readable recording medium is particularly designed and configured for the inventive concept, or is well known to one of ordinary skill in the art.

Examples of the computer-readable recording medium may include magnetic media such as hard disks, floppy disks and magnetic tapes, optical media such as CD-ROM, and DVD, magneto-optical media such as floptical disks, and hardware devices that are particularly configured to store and execute a program command, such as read only memories (ROMs), random access memories RAMs, and flash memories.

Examples of the program command may include a high-level language code that is executed by a computer by using an interpreter or the like as well as a machine language that is produced by a compiler. The hardware device may be configured to serve as at least one software module, in order to perform operations according to the present exemplary embodiment.

Figure 6:
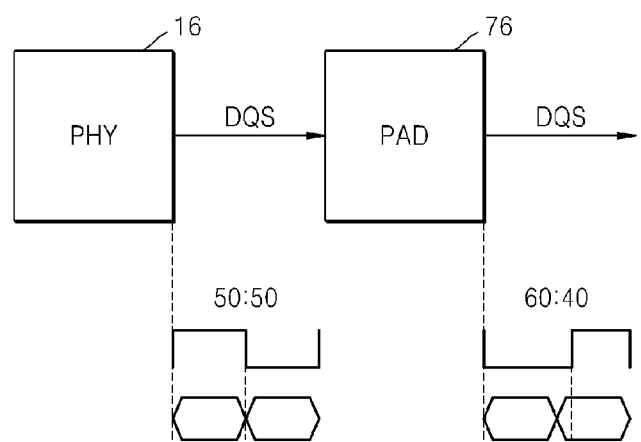
FIG. 6 is a diagram illustrating an external interface connected to a clock signal output from a PHY block of FIG. 2 through a pad, according to an exemplary embodiment.

Even when the duty ratio of the clock signal DQS is adjusted to be 50:50 in the PHY block 16 by using the duty ratio correction method shown in FIG. 5, the clock signal DQS output from the PHY block 16 may be connected to an external interface through a pad 76, as shown in FIG. 6.

Referring to FIG. 6, skew may occur in the clock signal DQS with a duty ratio of 50:50, which is output from the PHY block 16, due to an influence of wiring capacitance, parasitic capacitance, and the like. Thus, a duty ratio of the clock signal DQS may be distorted by the pad 76. When the duty ratio of the clock signal DQS is distorted to be, for example, 60:40 at the pad 76, the clock signal DQS with the distorted duty ratio may be provided to a device interfacing with the pad 76, for example, a host or a memory device. In this case, the host or the memory device may have a disadvantage in that an operational timing margin is reduced due to the received clock signal DQS. To address this disadvantage, it is advantageous to correct a duty ratio of the clock signal DQS at the pad 76 that interfaces with an external device.

Figure 7:
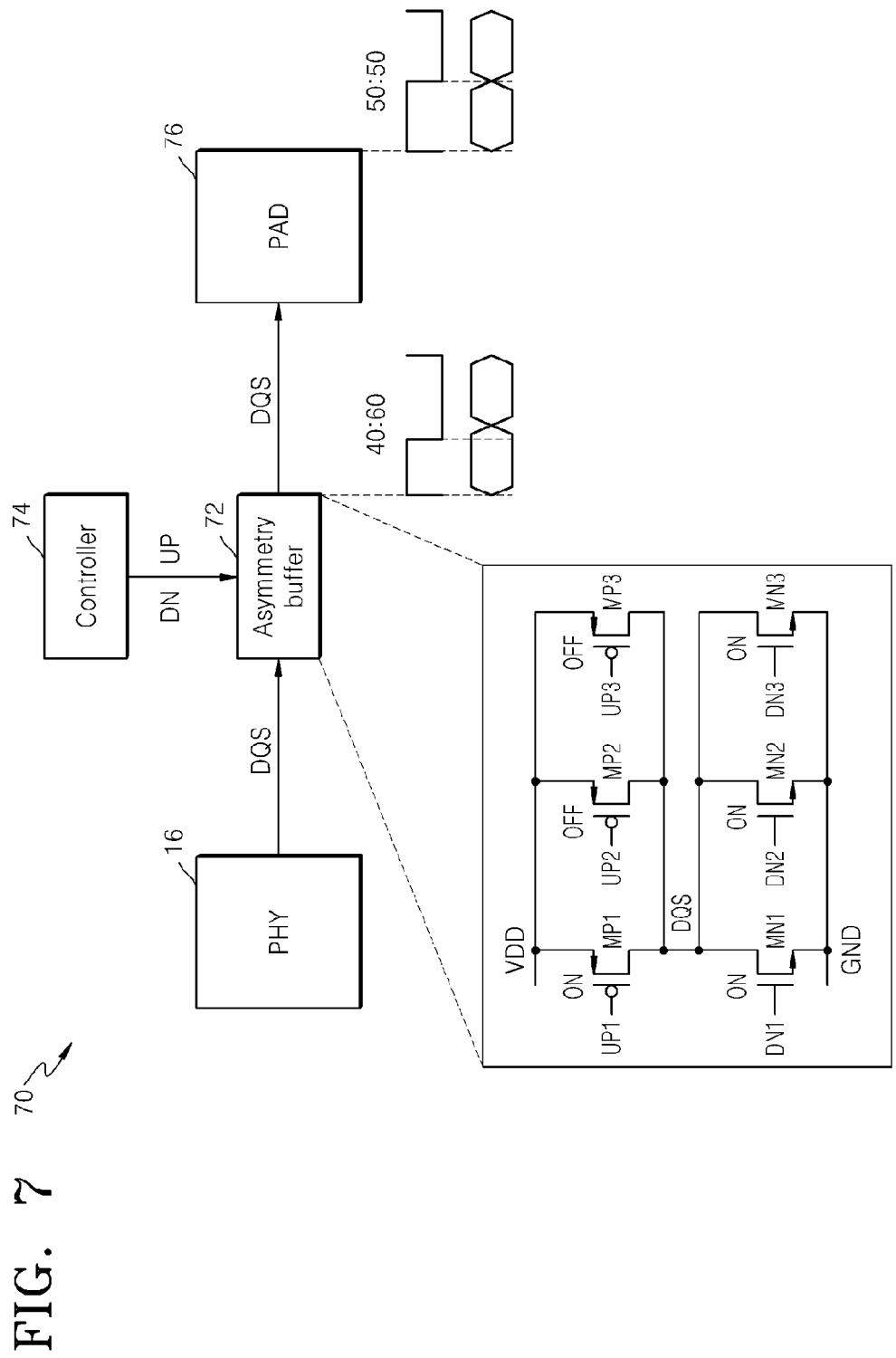
FIG. 7 is a block diagram of a duty ratio correction circuit according to another exemplary embodiment.

FIG. 7 is a block diagram of a duty ratio correction circuit 70 according to another exemplary embodiment.

Referring to FIG. 7, the duty ratio correction circuit 70 includes the PHY block 16, an asymmetry buffer 72, and a controller 74. The duty ratio correction circuit 70 is connected to the pad 76. The PHY block 16 may include a DLL circuit unit. The PHY block 16 may adjust timing so that a rising/falling edge of the clock signal DQS is generated to correspond to an intermediate portion of a window of data (not shown). In addition, the PHY block 16 may supply the clock signal DQS with a duty ratio of 50:50.

The asymmetry buffer 72 receives the clock signal DQS supplied from the PHY block 16 and supplies the clock signal DQS to the pad 76. In addition, the asymmetry buffer 72 adjusts the duty ratio of the clock signal DQS in response to a first control signal UP and a second control signal DN output from the controller 74 and supplies the clock signal DQS to the pad 76. The asymmetry buffer 72 may have the same configuration as that of the asymmetry buffer 14 described with reference to FIG. 3.

As shown in FIG. 6, the clock signal DQS with a duty ratio of 50:50, which is output from the PHY block 16, may be distorted by the pad 76 to have a duty ratio of, for example, 60:40 at the pad 76 due to an influence of wiring capacitance, parasitic capacitance, and the like. In this case, in order to adjust the duty ratio of the clock signal DQS at the pad 76 to be 50:50, the controller 74 may generate the first control signal UP and a second control signal DN by using the duty ratio correction method shown in FIG. 5. The first control signal UP and a second control signal DN are used to adjust the duty ratio of the clock signal DQS. The first control signal UP and a second control signal DN may be set so that when the first control signal UP is activated, a high level duration of the clock signal DQS may be increased, and when the second control signal DN is activated, a low level duration of the clock signal DQS may be increased.

When it is expected that a duty ratio of the clock signal DQS, which is received by the pad 76, is distorted to have a duty ratio of, for example, 60:40, the controller 74 selectively activates control signals UP1, DN1, DN2, and DN3 so as to turn on the PMOS transistor MP1 and the NMOS transistors MN1 through MN3 of the asymmetry buffer 72, respectively. As the driving strength from the ground voltage GND is increased compared to the driving strength from the power voltage VDD, a high level duration of the clock signal DQS is reduced and a low level duration of the clock signal DQS is increased so that a duty ratio of the clock signal DQS in the asymmetry buffer 72 is adjusted to be 40:60. Thus, the duty ratio of the clock signal DQS at the pad 76 is corrected from 60:40 to 50:50. Whether it is expected that a duty ratio of the clock signal DQS, which is received by the pad 76, is distorted may be determined by, for example, experimental measurements.

The duty ratio correction method of the controller 74, according to the present exemplary embodiment, may alternatively be embodied as a program that is executed by various types of computers and may be recorded in a computer-readable recording medium. The computer-readable recording medium may include a program command, a data file, a data structure, and the like, which are used alone or in combination thereof. The program command recorded in the computer-readable recording medium is particularly designed and configured for the inventive concept, or is well known to one of ordinary skill in the art.

Examples of the computer-readable recording medium may include magnetic media such as hard disks, floppy disks and magnetic tapes, optical media such as CD-ROM, and DVD, magneto-optical media such as floptical disks, and hardware devices that are particularly configured to store and execute a program command, such as read only memories (ROMs), random access memories (RAMs), and flash memories.

Examples of the program command may include a high-level language code that is executed by a computer by using an interpreter or the like as well as a machine language that is produced by a compiler. The hardware device may be configured to serve as at least one software module, in order to perform operations according to the present embodiment.

Figure 8:
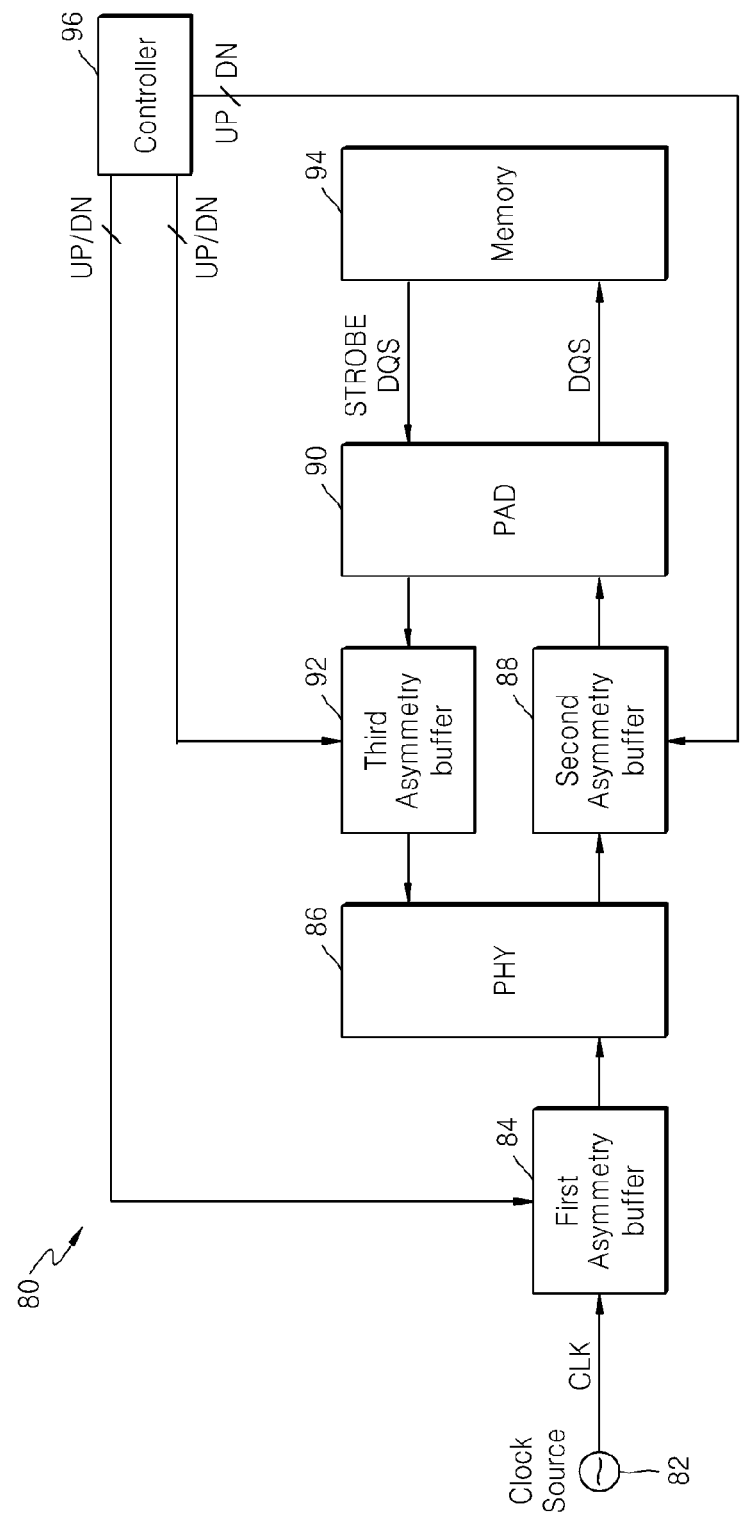
FIG. 8 is a block diagram of a duty ratio correction circuit according to another exemplary embodiment.

FIG. 8 is a block diagram of a duty ratio correction circuit according to another exemplary embodiment.

Referring to FIG. 8, the duty ratio correction circuit 80 includes a first asymmetry buffer 84, a second asymmetry buffer 88, and a third asymmetry buffer 92, and a PHY block 86. The duty ratio correction circuit 80 may be connected to a clock source 82. The duty ratio correction circuit 80 may further include a controller 96 for controlling the first asymmetry buffer 84, the second asymmetry buffer 88, and the third asymmetry buffer 92. The duty ratio correction circuit 80 may be connected to a pad 90 and may be connected to a memory device 94 as an external interface through the pad 90.

The clock source 82 supplies a first clock signal CLK. A duty ratio of the first clock signal CLK may be distorted due to unstable supply by the clock source unit 82.

The first asymmetry buffer 84 receives the first clock signal CLK supplied from the clock source unit 82 and provides the first clock signal CLK to the PHY block 86. The first asymmetry buffer 84 adjusts the duty ratio of the first clock signal CLK in response to a first control signal and a second control signal DN output from the controller 96 and provides the first clock signal CLK to the PHY block 86.

The PHY block 86 may include a DLL circuit unit and may generate a second clock signal DQS from the first clock signal CLK. The PHY block 86 may adjust timing so that a rising/falling edge of the second clock signal DQS is generated to correspond to an intermediate portion of a window of data (not shown).

The second asymmetry buffer 88 receives the second clock signal DQS output from the PHY block 86 and provides the second clock signal DQS to the pad 90. A duty ratio of the second clock signal DQS output from the PHY block 16 may be distorted due to influence of wiring capacitance, parasitic capacitance, and the like. The second asymmetry buffer 88 adjusts the duty ratio of the second clock signal DQS to be 50:50 in response to a first control signal and a second control signal DN output from the controller 96 and provides the second clock signal DQS to the pad 90. The first control signal UP and the second control signal DN may be different than those supplied to the first asymmetry buffer 84.

Thus, the second clock signal DQS of which a duty ratio is adjusted to be 50:50 is provided to the memory device 94 through the pad 90. The memory device 94 may receive write data (not shown) according to the second clock signal DQS and may store the write data in an internal circuit, particularly, in a memory cell. In this case, a rising/falling edge of the second clock signal DQS may be generated to correspond to an intermediate portion of a window of the write data.

The memory device 94 may output data read from the memory cell according to a data strobe signal STROBE DQS. The data strobe signal STROBE DQS output from the memory device 94 may be provided as the second clock signal DQS to the duty ratio correction circuit 80 through the pad 90. In this case, a rising/falling edge of the data strobe signal STROBE DQS may be generated to correspond to an intermediate portion of a window of the read data.

A duty ratio of the second clock signal DQS received by the pad 90 from the memory device 94 may be distorted due to influence of wiring capacitance, parasitic capacitance, and the like. The pad 90 may be connected to the third asymmetry buffer 92. The third asymmetry buffer 92 adjusts the duty ratio of the second clock signal DQS that is transmitted through the pad 90. The third asymmetry buffer 92 adjusts the duty ratio of the second clock signal DQS to be 50:50 in response to a first control signal and a second control signal DN output from the controller 96 and provides the second clock signal DQS to the PHY block 86. The first control signal UP and the second control signal DN may be different from those provided to the first asymmetry buffer 84 and the second asymmetry buffer 88. The controller 96 generates the first control signal UP and the second control signal DN by using the duty ratio correction method shown in FIG. 5.

The PHY block 86 may adjust timing so that a rising/falling edge of the second clock signal DQS is generated to correspond to an intermediate portion of a window of data read from the memory device 94.

The duty ratio correction method of the controller 96, according to the present exemplary embodiment, may alternatively be embodied as a program that is executed by various types of computers and may be recorded in a computer-readable recording medium. The computer-readable recording medium may include a program command, a data file, a data structure, and the like, which are used alone or in combination thereof. The program command recorded in the computer-readable recording medium is particularly designed and configured for the inventive concept, or is well known to one of ordinary skill in the art.

Examples of the computer-readable recording medium may include magnetic media such as hard disks, floppy disks and magnetic tapes, optical media such as CD-ROM, and DVD, magneto-optical media such as floptical disks, and hardware devices that are particularly configured to store and execute a program command, such as ROMs, RAMs, and flash memories.

Examples of the program command may include a high-level language code that is executed by a computer by using an interpreter or the like as well as a machine language that is produced by a compiler. The hardware device may be configured to serve as at least one software module, in order to perform operations according to the present embodiment.

While the inventive concept has been particularly shown and described with reference to exemplary embodiments thereof, it will be understood that various changes in form and details may be made therein without departing from the spirit and scope of the following claims.

What is claimed is:

1. A duty ratio correction circuit comprising:
   an asymmetry buffer that receives a clock signal and adjusts a duty ratio of the clock signal in response to control signals;
   a clock generating circuit that is connected to the asymmetry buffer and detects the duty ratio of the clock signal; and
   a controller that generates the control signals according to the duty ratio of the clock signal,
   wherein an operation of the controller is recorded as a program on a computer-readable recording medium,
   wherein the clock generating circuit further comprises a comparator that detects the duty ratio of the clock signal.

2. The duty ratio correction circuit of claim 1, wherein the asymmetry buffer comprises:
   a plurality of PMOS transistors that are connected in parallel to each other between a power voltage and the clock signal and are selectively turned on in response to first control signals of the control signals; and
   a plurality of NMOS transistors that are connected in parallel to each other between the clock signal and a ground voltage and are selectively turned on in response to second control signals of the control signals.

3. The duty ratio correction circuit of claim 2, wherein the plurality of PMOS transistors have a same size, and the plurality of NMOS transistors have a same size.

4. The duty ratio correction circuit of claim 2, wherein the plurality of PMOS transistors have different sizes, and the plurality of NMOS transistors have different sizes.

5. The duty ratio correction circuit of claim 1, wherein the clock generating circuit comprises a delay locked loop (DLL) circuit and outputs the clock signal so that a rising edge or a falling edge of the clock signal is generated to correspond to an intermediate portion of a window of data.

6. The duty ratio correction circuit of claim 1, wherein the controller generates the control signals in order to correct a skew of the clock signal, the skew occurring at a pad connected to the clock generating circuit.

7. A duty ratio correction circuit comprising:
   a first asymmetry buffer that receives a first clock signal and adjusts a duty ratio of the first clock signal in response to first control signals;
   a clock generating circuit that is connected to the first asymmetry buffer, receives the first clock signal, and generates a second clock signal;
   a second asymmetry buffer that receives the second clock signal, adjusts a duty ratio of the second clock signal in response to second control signals, and transfers the second clock signal to a pad; and
   a controller that generates the first control signals and the second control signals,
   wherein an operation of the controller is recorded as a program on a computer-readable recording medium.

8. The duty ratio correction circuit of claim 7, wherein the first control signals comprise third control signals and fourth control signals, and
   the first asymmetry buffer comprises:
      a plurality of PMOS transistors that are connected in parallel to each other between a power voltage and the first clock signal and are selectively turned on in response to the third control signals; and
      a plurality of NMOS transistors that are connected in parallel to each other between the first clock signal and a ground voltage and are selectively turned on in response to the fourth control signals.

9. The duty ratio correction circuit of claim 7, wherein the second control signals comprise fifth control signals and sixth control signals, and the second asymmetry buffer comprises:
- a plurality of PMOS transistors that are connected in parallel to each other between a power voltage and the second clock signal and are selectively turned on in response to the fifth control signals; and
- a plurality of NMOS transistors that are connected in parallel to each other between the second clock signal and a ground voltage and are selectively turned on in response to the sixth control signals.

10. The duty ratio correction circuit of claim 7, wherein the clock generating circuit further comprises a comparator that detects the duty ratio of the first clock signal.

11. The duty ratio correction circuit of claim 7, wherein the clock generating circuit comprises a delay locked loop (DLL) circuit, and outputs the second clock signals so that a rising edge or a falling edge of the second clock signals is generated to correspond to an intermediate portion of a window of data.

12. The duty ratio correction circuit of claim 7, further comprising a third asymmetry buffer connected between the pad and the clock generating circuit, wherein the third asymmetry buffer receives a third clock signal transmitted through the pad to the third asymmetry buffer and adjusts a duty ratio of the third clock signal in response to the seventh control signals.

13. The duty ratio correction circuit of claim 12, wherein the seventh control signals comprise eighth control signals and ninth control signals, and the third asymmetry buffer comprises:
- a plurality of PMOS transistors that are connected in parallel to each other between a power voltage and the second clock signal and are selectively turned on in response to the eighth control signals; and
- a plurality of NMOS transistors that are connected in parallel to each other between the third clock signal and a ground voltage and are selectively turned on in response to the ninth control signals.

14. The duty ratio correction circuit of claim 12, wherein the clock generating circuit comprises a delay locked loop (DLL) circuit, and outputs the third clock signal so that a rising edge or a falling edge of the third clock signals is generated to correspond to an intermediate portion of a window of data.

15. A duty ratio correction circuit comprising:
- an asymmetry buffer comprising a plurality of PMOS transistors and a plurality of NMOS transistors, and that adjusts a number of the plurality of PMOS transistors that are turned on according to first control signals respectively supplied to each of the PMOS transistors, and that adjusts a number of the plurality of NMOS transistors that are turned on according to second control signals respectively supplied to each of the NMOS transistors, the asymmetry buffer adjusting a duty ratio of a clock signal in response to the first control signals and the second control signals;
- a PHY block that is connected to the asymmetry buffer and that detects the duty ratio of the clock signal; and
- a controller that generates the first control signals and the second control signals according to the duty ratio detected by the PHY block.

16. The duty ratio correction circuit of claim 15, wherein the controller is programmed by a computer program to generate the first control signals and the second controls signals by applying an algorithm to the duty ratio detected by the PHY block.

17. The duty ratio correction circuit of claim 15, wherein the PHY block comprises a delay locked loop (DLL) that detects the duty ratio.

18. The duty ratio correction circuit of claim 15, wherein the plurality of PMOS transistors is connected to a power voltage line and the clock signal, and the plurality of NMOS transistors is connected to ground and the clock signal.

* * * * *